United States Patent
Choo et al.

(10) Patent No.: US 12,323,573 B2
(45) Date of Patent: Jun. 3, 2025

(54) IMAGE SENSORS FOR ADVANCED DRIVER ASSISTANCE SYSTEMS UTILIZING REGULATOR VOLTAGE VERIFICATION CIRCUITRY TO DETECT MALFUNCTIONS

(71) Applicant: STMicroelectronics Asia Pacific Pte Ltd, Singapore (SG)

(72) Inventors: Hong Chean Choo, Johor Bahru (MY); Lookah Chua, Singapore (SG); Wai Yin Hnin, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 439 days.

(21) Appl. No.: 17/736,504

(22) Filed: May 4, 2022

(65) Prior Publication Data

US 2022/0264082 A1    Aug. 18, 2022

Related U.S. Application Data

(62) Division of application No. 16/514,695, filed on Jul. 17, 2019, now Pat. No. 11,356,654.
(Continued)

(51) Int. Cl.
*H04N 17/00* (2006.01)
*G01R 19/00* (2006.01)
(Continued)

(52) U.S. Cl.
CPC ....... *H04N 17/002* (2013.01); *G01R 19/0038* (2013.01); *G01R 19/2506* (2013.01);
(Continued)

(58) Field of Classification Search
CPC .............................. H04N 25/69; H04N 25/78
(Continued)

(56) References Cited

U.S. PATENT DOCUMENTS 6,100,833 A    8/2000 Park
6,333,750 B1   12/2001 Odryna et al.
(Continued)

FOREIGN PATENT DOCUMENTS

| CN | 101512905 A | 8/2009 |
|---|---|---|
| CN | 102624392 A | 8/2012 |
| CN | 102655411 A | 9/2012 |

OTHER PUBLICATIONS

Second Office Action and Search Report for counterpart CN Appl. No. 202211058157.0, report dated Jul. 15, 2024, 17 pgs.
(Continued)

*Primary Examiner* — Joel W Fosselman
(74) *Attorney, Agent, or Firm* — Crowe & Dunlevy LLC

(57) ABSTRACT

An electronic device includes a pixel array having a plurality of rows with active imaging pixels, and at least one row with test pixels. Each of the test pixels includes a test voltage generation circuit generating a test voltage, a switching circuit receiving the test voltage and an image pixel output signal and passing the test voltage as output when in a test mode, a comparison circuit receiving the output from the switching circuit and an analog to digital conversion signal and asserting a counter reset signal when the output from the switching circuit and the analog to digital conversion signal are equal in voltage, and a counter beginning counting at a beginning of each test cycle within the test mode, stopping counting upon assertion of the counter reset signal, and outputting its count upon stopping counting. The count is proportional to the test voltage when in the test mode.

13 Claims, 10 Drawing Sheets

Related U.S. Application Data

(60) Provisional application No. 62/713,175, filed on Aug. 1, 2018.

(51) Int. Cl.
  *G01R 19/25* (2006.01)
  *H04N 25/69* (2023.01)
  *H04N 25/78* (2023.01)
  *G08G 1/16* (2006.01)

(52) U.S. Cl.
  CPC ............ *H04N 25/69* (2023.01); *H04N 25/78* (2023.01); *G08G 1/16* (2013.01)

(58) Field of Classification Search
  USPC ........................................................ 348/294
  See application file for complete search history.

(56) References Cited

U.S. PATENT DOCUMENTS

| | | | |
|---|---|---|---|
| 6,400,220 | B1 | 6/2002 | Wang et al. |
| 6,597,395 | B1 | 7/2003 | Kim et al. |
| 6,797,933 | B1 | 9/2004 | Mendis et al. |
| 8,953,047 | B2 | 2/2015 | Martinussen |
| 9,419,052 | B2 | 8/2016 | Amikawa et al. |
| 10,498,996 | B2 | 12/2019 | Nakamura |
| 2003/0214596 | A1 | 11/2003 | Simony |
| 2004/0036453 | A1 | 2/2004 | Rossi |
| 2005/0057389 | A1 | 3/2005 | Krymski |
| 2006/0007329 | A1 | 1/2006 | Panicacci |
| 2009/0284629 | A1 | 11/2009 | Nakao et al. |
| 2012/0169909 | A1* | 7/2012 | Rysinski ............... H04N 25/78 348/E5.091 |
| 2012/0274808 | A1 | 11/2012 | Chong et al. |
| 2013/0321672 | A1 | 12/2013 | Silverstein et al. |
| 2013/0321673 | A1 | 12/2013 | Lim et al. |
| 2013/0321674 | A1 | 12/2013 | Cote et al. |
| 2013/0321675 | A1 | 12/2013 | Cote et al. |
| 2013/0321676 | A1 | 12/2013 | Silverstein et al. |
| 2013/0321677 | A1 | 12/2013 | Cote et al. |
| 2013/0321678 | A1 | 12/2013 | Cote et al. |
| 2013/0321700 | A1 | 12/2013 | Cote et al. |
| 2014/0098272 | A1 | 4/2014 | Nakamura et al. |
| 2014/0327775 | A1 | 11/2014 | Cho |
| 2015/0285625 | A1 | 10/2015 | Deane |
| 2016/0100116 | A1 | 4/2016 | Mesgarini |
| 2016/0286145 | A1 | 9/2016 | Demonte et al. |
| 2016/0295205 | A1 | 10/2016 | Lim et al. |
| 2017/0272740 | A1 | 9/2017 | Clark et al. |
| 2018/0292206 | A1 | 10/2018 | Ohki |
| 2019/0149755 | A1 | 5/2019 | Yasuma |
| 2019/0149758 | A1 | 5/2019 | Nakamura |
| 2019/0222783 | A1 | 7/2019 | Nishihara et al. |
| 2019/0373190 | A1 | 12/2019 | Kawazu et al. |

OTHER PUBLICATIONS

EP Search Report and Written Opinion for EP Appl. No. 19187286 dated Dec. 11, 2019 (13 pages).
CN First Office Action and Search Report for co-pending CN Appl. No. 201910706586.6 dated Jan. 21, 2021 (11 pages).
Tarek Lule et al: "High Performance 1.3MPix HDR Automotive Image Sensor," Jun. 11, 2015, Retrieved From the Internet on Nov. 19, 2019, p. 2, Line 38-39, Fig 1, 2.
On Semiconductor: "Evaluating Functional Safety in Automotive Image Sensors Evaluating Functional Safety in Automotive Image Sensors," May 1, 2018, Retrieved on Nov. 19, 2019 From the Internet.
Fei Richun et al: "BIST of Interconnection Lines in the Pixel Matrix of CMOS Imagers," 5th IEEE International Workshop On Advances in Sensors and Interfaces IWASI IEEE Jun. 13, 2013, pp. 174-177.

* cited by examiner

IMAGE SENSORS FOR ADVANCED DRIVER ASSISTANCE SYSTEMS UTILIZING REGULATOR VOLTAGE VERIFICATION CIRCUITRY TO DETECT MALFUNCTIONS

CROSS REFERENCE TO RELATED APPLICATIONS

This is application is a division of U.S. patent application Ser. No. 16/514,695, filed Jul. 17, 2019, which claims priority to United States Provisional Application for Patent No. 62/713,175, filed on Aug. 1, 2018, the contents of which are incorporated by reference to the maximum extent allowable under the law.

TECHNICAL FIELD

This disclosure is related to the field of image sensors for advanced driver assistance systems, and more particularly, to circuits and techniques for the verification of the production of proper voltages by voltage regulators used with such image sensors to detect improper function of those regulators.

BACKGROUND

Modern vehicles are increasingly equipped with advanced driver assistance systems (ADAS).

ADAS enable vehicle features such as automated lighting, adaptive cruise control, automatic braking, collision warnings, proximity warnings, traffic and road condition warnings, connectivity with smartphones, lane keep assist, blind spot monitoring, and automated driving modes. In addition to being used for driver comfort and assistance, these systems may be used for collision avoidance to increase safety. For example, if a driver fails to respond to a proximity warning, automatic braking may allow the vehicle to stop on its own, avoiding a potential collision. Automated driving may function so as to steer the vehicle around dangers, or to steer the vehicle back into its lane if the driver begins to drift out of the lane.

ADAS rely on inputs from multiple data sources, including digital imaging, light detection and ranging, radar, image processing, computer vision, and in-car networking. Additional inputs are possible from other sources separate from the primary vehicle platform, such as other vehicles (referred to as vehicle-to-vehicle systems) or from infrastructure such as cellular data or wireless internet systems (referred to as vehicle-to-infrastructure systems).

A primary sensor for many ADAS systems is an image sensor. As ADAS systems have progressed from driver assistance to include the automation and safety functions discussed above, the safe operation of a vehicle employing an ADAS system will depend more and more on the reliability of the image sensor and imaging system. Therefore, the reliable operation of the image sensor has become a critical safety component in many modern vehicles.

As a consequence, the ISO 26262 standard was developed to include the Automotive Safety Integrity Level (ASIL) risk classification scheme. The ASIL levels range from the lowest, ASIL-A (lowest), to ASIL-D (highest). An ASIL level is determined by three factors, namely the severity of a failure, the probability of a failure occurring, and the ability for the effect of the failure to be controlled.

Faults in the image sensors or image sensing or image sensing subsystems of ADAS systems may arise from a number of causes, including improperly operating voltage regulators. Due to the importance of the operation of an image sensor in an ADAS system, it is therefore desired to detect faults in the operation of an image sensor in an ADAS system or in an image sensing subsystem as quickly as possible.

SUMMARY

An electronic device includes a test voltage generation circuit configured to generate a test voltage as a function of a regulator voltage, and a switching circuit configured to receive the test voltage and an image pixel output signal and also configured to pass the test voltage as output when in a test mode. The electronic device also includes a comparison circuit configured to receive the output from the switching circuit and an analog to digital conversion signal, and to assert a counter reset signal when the output from the switching circuit and the analog to digital conversion signal are equal in voltage. The electronic device also includes a counter configured to begin counting at a beginning of each test cycle within the test mode, to stop counting upon assertion of the counter reset signal, and to output its count upon stopping counting. The count is proportional to the test voltage when in the test mode.

The test voltage generation circuit may be configured to generate upper and lower test voltages representing upper and lower expected voltages of the image pixel output signal, and the test voltage generation circuit may be configured to pass the upper test voltage as the test voltage in response to assertion of a multiplexer select signal, and to pass the lower test voltage as the test voltage in response to deassertion of the multiplexer select signal.

The test voltage generation circuit may include a voltage divider coupled between the regulator voltage and a reference voltage, with a first tap of the voltage divider producing the upper test voltage and a second tap of the voltage divider producing the lower test voltage, and a multiplexer having inputs coupled to the first and second taps of the voltage divider to receive the upper and lower test voltages, and to pass the upper or lower test voltage as output based upon a logic level of the multiplexer select signal.

The test voltage generation circuit may also include an AND gate configured to receive as input a master test mode enable signal and an individual pixel test mode enable signal, and to generate a test mode enable signal as a result of a logical AND operation between the master test mode enable signal and the individual pixel test mode enable signal. The test voltage generation circuit may also include a first switch selectively coupling the regulator voltage to the voltage divider in response to the test mode enable signal, a second switch selectively shunting the voltage divider to ground in response to an inverse of the test mode enable signal, and a third switch selectively shunting the output of the multiplexer to ground in response to the inverse of the test mode enable signal.

The comparison circuit may include a comparator receiving the output from the switching circuit at a first terminal through a first capacitor and the output from the analog to digital conversion signal at a second terminal through a second capacitor, and the analog to digital conversion signal may include a voltage ramping signal ramping in a repeating pattern between, in order, a base voltage, a first voltage, the base voltage, and a second voltage, with the first voltage being unequal to the second voltage, and with the first and second voltages being unequal to the base voltage.

The voltage ramping signal may ramp to the first voltage when the multiplexer is set by the multiplexer select signal to pass the upper test voltage and may ramp to the second voltage when the multiplexer is set by the multiplexer select signal to pass the lower test voltage.

There may be a plurality of additional counters and a plurality of additional comparison circuits. The plurality of additional comparison circuits may each be configured to selectively receive the output from the switching circuit and the analog to digital conversion signal, and to assert a counter reset signal associated with a given additional counter when the output from the switching circuit and the analog to digital conversion signal are equal in voltage. Each of the plurality of additional counters may be configured to begin counting at the beginning of each test cycle within the test mode, to stop counting upon assertion of the counter reset signal associated with that additional counter, and to output its count upon stopping counting.

The switching circuit may be configured to couple its output to each of the plurality of additional comparison circuits.

The switching circuit may be configured to couple its output to a subset of the plurality of additional comparison circuits.

An electronic device includes a voltage regulator configured to generate a regulated voltage, and a pixel array including a plurality of rows with active imaging pixels, and at least one row with test pixels. The plurality of rows with active imaging pixels, and the at least one row with test pixels, operate based upon the regulated voltage. Each of the test pixels includes a test voltage generation circuit configured to generate a test voltage as a function of the regulated voltage, a switching circuit configured to receive the test voltage and an image pixel output signal and configured to pass the test voltage as output when in a test mode, a comparison circuit configured to receive the output from the switching circuit and an analog to digital conversion signal and configured to assert a counter reset signal when the output from the switching circuit and the analog to digital conversion signal are equal in voltage, and a counter configured to begin counting at a beginning of each test cycle within the test mode, and configured to stop counting upon assertion of the counter reset signal, and to output its count upon stopping counting. The count is proportional to the test voltage when in the test mode.

A processor may be configured to receive output from the counters of the test pixels, to compare those outputs to expected values, and to perform at least one action based upon those outputs not being within a threshold of the expected values.

The test voltage generation circuit may be configured to generate upper and lower test voltages representing upper and lower expected voltages of the image pixel output signal, and the test voltage generation circuit may be configured to pass the upper test voltage as the test voltage in response to assertion of a multiplexer select signal, and to pass the lower test voltage as the test voltage in response to deassertion of the multiplexer select signal.

The test voltage generation circuit may include a voltage divider coupled between the regulated voltage and a reference voltage, with a first tap of the voltage divider producing the upper test voltage and a second tap of the voltage divider producing the lower test voltage. The test voltage generation circuit may also include a multiplexer having inputs coupled to the first and second taps of the voltage divider to receive the upper and lower test voltages, and to pass the upper or lower test voltage as output based upon a logic level of the multiplexer select signal.

The test voltage generation circuit may also include an AND gate configured to receive as input a master test mode enable signal and an individual pixel test mode enable signal, and to generate a test mode enable signal as a result of a logical AND operation between the master test mode enable signal and the individual pixel test mode enable signal. The test voltage generation circuit may also include a first switch selectively coupling the regulated voltage to the voltage divider in response to the test mode enable signal, a second switch selectively shunting the voltage divider to ground in response to an inverse of the test mode enable signal, and a third switch selectively shunting the output of the multiplexer to ground in response to the inverse of the test mode enable signal.

The comparison circuit may include a comparator receiving the output from the switching circuit at a first terminal through a first capacitor and the output from the analog to digital conversion signal at a second terminal through a second capacitor, and the analog to digital conversion signal may include a voltage ramping signal ramping in a repeating pattern between, in order, a base voltage, a first voltage, the base voltage, and a second voltage, with the first voltage being unequal to the second voltage, and with the first and second voltages being unequal to the base voltage.

The ramping signal may ramp to the first voltage when the multiplexer is set by the multiplexer select signal to pass the upper test voltage and ramps to the second voltage when the multiplexer is set by the multiplexer select signal to pass the lower test voltage.

A method includes providing an array of image pixels including a plurality of rows with active imaging pixels and at least one row with test pixels, with the plurality of rows with active imaging pixels, and the at least one row with test pixels, operate based upon a regulated voltage. The method may also include testing the regulated voltage by activating the at least one row with test pixels to operate in test mode, generating a test black voltage and a test white voltage as a function of the regulated voltage, alternatively passing the test black voltage and the test white voltage to a switching circuit as a test voltage, passing the test voltage from the switching circuit to a comparison circuit that asserts a counter reset signal when the test voltage and an analog to digital conversion signal are equal in voltage, and resetting and starting a counter at a beginning of each test cycle within the test mode, stopping the counter upon assertion of the counter reset signal, and outputting the count of the counter, the count being proportional to the test voltage when in the test mode.

The analog to digital conversion signal may include a voltage ramping signal ramping in a repeating pattern between, in order, a base voltage, a first voltage, the base voltage, and a second voltage, with the first voltage being unequal to the second voltage, and with the first and second voltages being unequal to the base voltage.

The voltage ramping signal may ramp to the first voltage when the test black voltage is being passed to the switching circuit as the test voltage, and may ramp to the second voltage when the test white voltage is being passed to the switching circuit as the test voltage.

A circuit includes a supply voltage node, at least one pixel powered from the supply voltage node and the at least one pixel including an imaging pixel and an analog to digital conversion circuit, and a test voltage generation circuit configured to generate a test voltage as a function of a voltage at the supply voltage node. The analog to digital conversion circuit is configured to, in a normal mode, sample output from the imaging pixel and provide its output as digital data. The analog to digital conversion circuit is configured to, in a test mode, sample the test voltage and provide its output as the digital data.

A processor may be configured to, in the test mode, receive the digital data from the analog to digital conversion circuit, compare the digital data to an expected value, and to take corrective action based upon the digital data not being substantially equal to the expected value.

The test voltage generation circuit may be configured to generate upper and lower test voltages representing upper and lower expected voltages of the output of the imaging pixel; wherein the test voltage generation circuit is configured to pass the upper test voltage as the test voltage in response to assertion of a multiplexer select signal, and to pass the lower test voltage as the test voltage in response to deassertion of the multiplexer select signal.

The test voltage generation circuit may include a voltage divider coupled between the supply voltage node and a reference node, with a first tap of the voltage divider producing the upper test voltage and a second tap of the voltage divider producing the lower test voltage, and a multiplexer having inputs coupled to the first and second taps of the voltage divider to receive the upper and lower test voltages and to pass the upper or lower test voltage as output based upon a logic level of the multiplexer select signal.

The test voltage generation circuit may include an AND gate configured to receive as input a master test mode enable signal and an individual pixel test mode enable signal, and to generate a test mode enable signal as a result of a logical AND operation between the master test mode enable signal and the individual pixel test mode enable signal. A first switch may selectively couple the supply voltage node to the voltage divider in response to the test mode enable signal. A second switch may selectively shunt the voltage divider to ground in response to an inverse of the test mode enable signal, and a third switch may selectively shunt the output of the multiplexer to ground in response to the inverse of the test mode enable signal.

The analog to digital conversion circuit may include a switching circuit configured to receive the test voltage and output from the imaging pixel and to pass the test voltage as output when in the test mode, a comparison circuit configured to receive the output from the switching circuit and an analog to digital conversion signal and to assert a counter reset signal when the output from the switching circuit and the analog to digital conversion signal are equal in voltage, and a counter configured to begin counting at a beginning of each test cycle within the test mode, to stop counting upon assertion of the counter reset signal, and to output its count upon stopping counting.

The comparison circuit may include a comparator receiving the output from the switching circuit at a first terminal through a first capacitor and the output from the analog to digital conversion signal at a second terminal through a second capacitor. The analog to digital conversion signal may include a voltage ramping signal ramping in a repeating pattern between, in order, a base voltage, a first voltage, the base voltage, and a second voltage, with the first voltage being unequal to the second voltage, and with the first and second voltages being unequal to the base voltage.

The ramping signal may ramp to the first voltage when the multiplexer is set by the multiplexer select signal to pass the upper test voltage and may ramp to the second voltage when the multiplexer is set by the multiplexer select signal to pass the lower test voltage.

An electronic device includes a pixel array including a plurality of rows with active imaging pixels, and at least one row with test pixels. Each of the test pixels includes a test voltage generation circuit configured to generate a test voltage, and a switching circuit configured to receive the test voltage and an image pixel output signal, and to pass the test voltage as output when in a test mode. Each test pixel also includes a comparison circuit configured to receive the output from the switching circuit and an analog to digital conversion signal, and to assert a counter reset signal when the output from the switching circuit and the analog to digital conversion signal are equal in voltage. Each test pixel also includes a counter configured to begin counting at a beginning of each test cycle within the test mode, to stop counting upon assertion of the counter reset signal, and to output its count upon stopping counting. The count is proportional to the test voltage when in the test mode.

A processor may be configured to receive output from the counters of the test pixels, to compare those outputs to expected values, and to perform at least one action based upon those outputs not being within a threshold of the expected values.

The test voltage generation circuit is configured to generate upper and lower test voltages representing upper and lower expected voltages of the image pixel output signal; wherein the test voltage generation circuit is configured to pass the upper test voltage as the test voltage in response to assertion of a multiplexer select signal, and to pass the lower test voltage as the test voltage in response to deassertion of the multiplexer select signal.

The test voltage generation circuit may include a voltage divider coupled to a reference voltage, with a first tap of the voltage divider producing the upper test voltage and a second tap of the voltage divider producing the lower test voltage. A multiplexer may have inputs coupled to the first and second taps of the voltage divider to receive the upper and lower test voltages, and to pass the upper or lower test voltage as output based upon a logic level of the multiplexer select signal.

The test voltage generation circuit may also include an AND gate configured to receive as input a master test mode enable signal and an individual pixel test mode enable signal, and to generate a test mode enable signal as a result of a logical AND operation between the master test mode enable signal and the individual pixel test mode enable signal. A first switch may selectively couple a regulated voltage to the voltage divider in response to the test mode enable signal. A second switch may selectively shunt the voltage divider to ground in response to an inverse of the test mode enable signal. A third switch may selectively shunt the output of the multiplexer to ground in response to the inverse of the test mode enable signal.

The comparison circuit may include a comparator receiving the output from the switching circuit at a first terminal through a first capacitor and the output from the analog to digital conversion signal at a second terminal through a second capacitor. The analog to digital conversion signal may include a voltage ramping signal ramping in a repeating pattern between, in order, a base voltage, a first voltage, the base voltage, and a second voltage, with the first voltage being unequal to the second voltage, and with the first and second voltages being unequal to the base voltage.

The ramping signal may ramp to the first voltage when the multiplexer is set by the multiplexer select signal to pass the upper test voltage and ramps to the second voltage when the multiplexer is set by the multiplexer select signal to pass the lower test voltage.

A method includes testing a regulated voltage by activating test pixels to operate in test mode, generating a test black voltage and a test white voltage as a function of the regulated voltage, alternatively passing the test black voltage and the test white voltage to a switching circuit as a test voltage, passing the test voltage from the switching circuit to a comparison circuit that asserts a counter reset signal when the test voltage and an analog to digital conversion signal are equal in voltage, and resetting and starting a counter at a beginning of each test cycle within the test mode, stopping the counter upon assertion of the counter reset signal, and outputting the count of the counter, the count being proportional to the test voltage when in the test mode.

The analog to digital conversion signal may include a voltage ramping signal ramping in a repeating pattern between, in order, a base voltage, a first voltage, the base voltage, and a second voltage, with the first voltage being unequal to the second voltage, and with the first and second voltages being unequal to the base voltage.

The voltage ramping signal may ramp to the first voltage when the test black voltage is being passed to the switching circuit as the test voltage, and may ramp to the second voltage when the test white voltage is being passed to the switching circuit as the test voltage.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
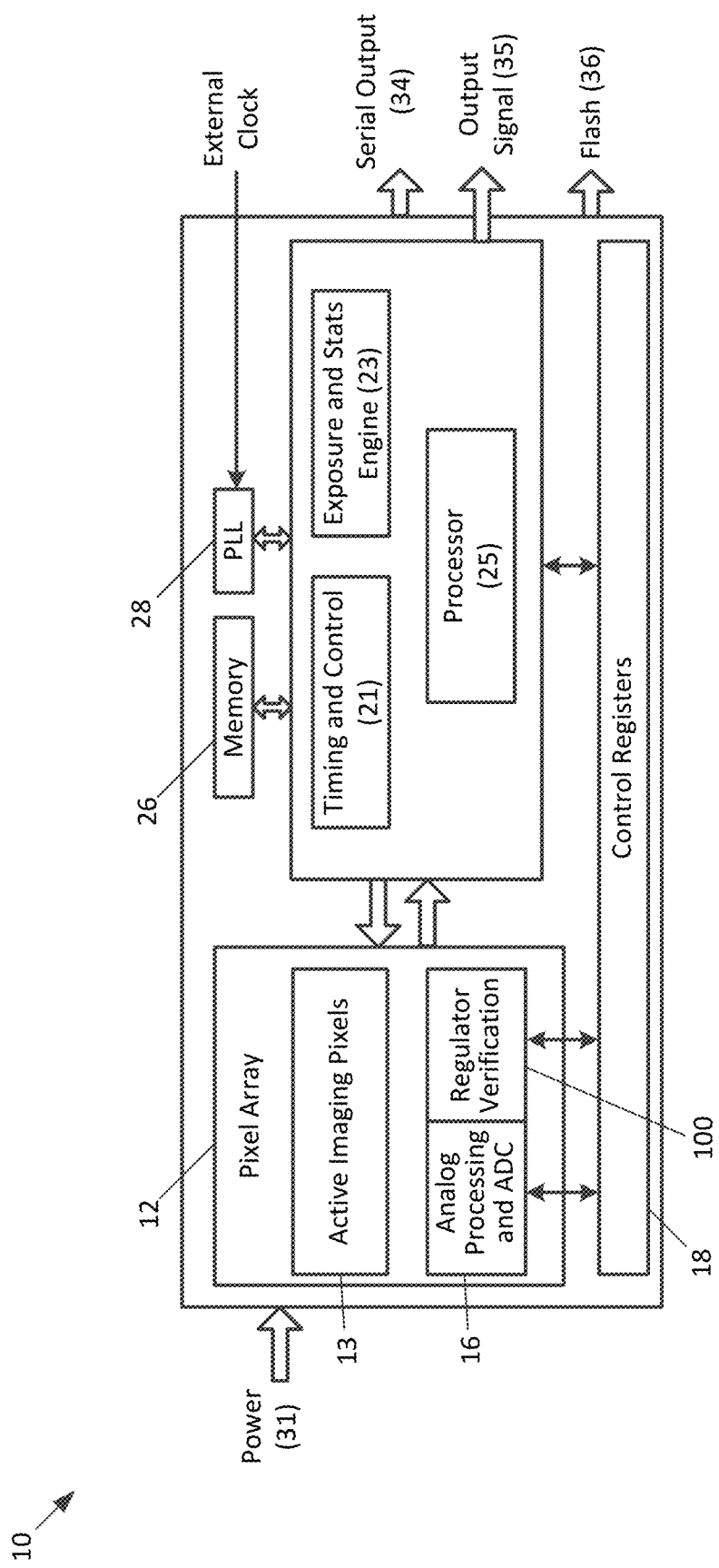
FIG. 1 is a block diagram of an advanced driver assistance system (ADAS) in accordance with this disclosure.

An advanced driver assistance system 10 is now described with reference to FIG. 1. The advanced driver assistance system 10 can be incorporated into an automobile, such as a car or light duty truck, or can be incorporated into commercial vehicles, such as class 8 vehicles (sometimes referred to as a "semi" or an "18 wheeler"). The advanced driver assistance system 10 includes a pixel array 12 with active imaging pixels 13, an analog to digital conversion (ADC) block 16, and a regulator voltage verification circuit 100. The active imaging pixels 13 capture image data in an analog format and provides the image data, in an analog fashion, to the analog processing and analog to digital conversion (ADC) block 16, which filters the image data in the analog domain and converts the image data to the digital domain to produce digital image data. The analog processing and analog to digital conversion block 16 passes the digital image data to the processor 25, which, pursuant to settings received from the control registers 18, performs desired digital processing functions, such as determining that the vehicle into which the advanced driver assistance system 10 is incorporated is headed toward an imminent collision, or whether the pixel array 12 is operating properly. A regulator voltage verification circuit 100 checks the voltages of voltage regulators used by the analog processing and analog to digital conversion block 16 as well as the active imaging pixels 13. The processor 25 provides its output signal 35 via a suitable data interface, such as a parallel data interface or a serial data interface, either directly to other components of the vehicle into which the advanced driver assistance system 10 is associated, or to such components via a data bus.

A phase locked loop (PLL) 28 provides a clock signal for use by the processor 25, and a memory 26 provides non-volatile or volatile data storage for use by the processor 25.

Figure 2:
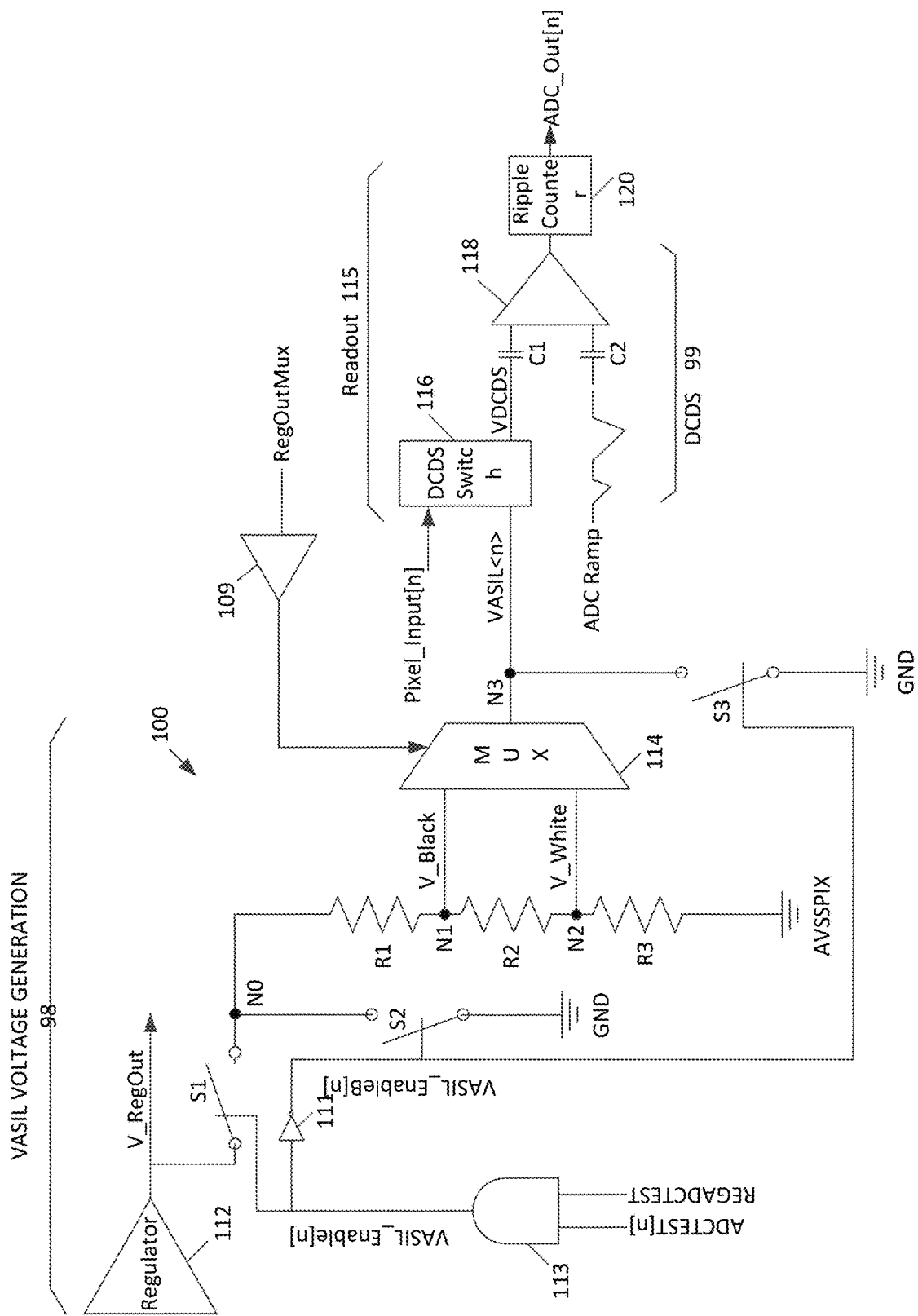
FIG. 2 is a block diagram for a regulator voltage verification circuit such as may be used in the ADAS of FIG. 1.

Further details of the pixel array 12 are now given with additional reference to FIG. 2. The regulator voltage verification circuit 100 shown in FIG. 2 and described below will be replicated multiple times. Therefore, the usage of [n] in the descriptions below is generic and used to indicate that a signal so labeled is specific to each instance of the regulator voltage verification circuit 100 and not global to all. It should be noted that signals not labeled with [n] may also in some instances be specific to each instance of the regulator voltage verification circuit 100. So, [n] is used herein is not limiting and is just an aid to ease reading.

The regulator voltage verification circuit 100 receives a regulator voltage V_RegOut from a voltage regulator 112 (which is common to the row of the pixel array 12 in which the regulator voltage verification circuit 100 resides).

AND gate 113 performs a logical AND operation on the ADCTEST[n] signal and the REGADCTEST signal to produce the VASIL_Enable[n] signal. REGADCTEST is fed to each AND gate 113 of each occurrence of the regulator voltage verification circuit 100, and serves as a master enable signal of the test operation, while a different ADCTEST[n] signal is fed to each AND gate 113 of each occurrence of the regulator voltage verification circuit 100, and serves as an enable signal for that particular regulator voltage verification circuit 100.

Switch S1 selectively couples V_RegOut to node NO in response to assertion of the VASIL_Enable[n] signal. Switch S2 selectively shunts node NO to ground in response to an inverse of the VASIL_Enable signal (inverted by inverter 111), labeled here as VASIL_EnableB[n] signal.

When testing of the voltage regulator 112 is desired, the VASIL_Enable[n] signal is asserted, closing switch S1 and opening switch S2. It follows that when testing of the voltage regulator 112 is not desired, the VASIL_Enable signal is deasserted, opening switch S1 and closing switch S2, shunting node NO to ground.

Resistors R1, R2, and R3 are coupled in series between node NO and reference voltage AVSSPIX to form a resistive divider circuit. A test voltage V_Black is produced at the tap N1 between resistors R1 and R2, and a test voltage V_White is produced at the tap N2 between resistors R2 and R3. V_Black is similar to the voltage that would be produced by a properly operating voltage regulator 112 at node N1 to simulate a pixel of the active imaging pixels 13 not detecting light, while V_White is similar to the voltage that would be produced by a properly operating voltage regulator 112 at node N2 to simulate a pixel of the active imaging pixels 13 being saturated with light.

Multiplexer 114 receives V_Black and V_white as inputs, and selectively outputs those voltages as VASIL<n> to the digital correlated double sampling (DCDS) switch unit 116 at node N3, in response to the RegOutMux signal as amplified by buffer 109. The switch S3 selectively shunts node N3 to ground in response to assertion of the VASIL_EnableB signal.

The voltage regulator 112, AND gate 113, inverter 111, switches S1-S3, resistors R1-R3, and multiplexer 114 can collectively be referred to as the VASIL voltage generation circuitry 98.

The DCDS switch unit 116 receives VASIL<n> and an output Pixel_Input[n] from a pixel of the array of pixels 12, and selectively outputs one of those voltages as VDCDS through capacitor C1 to comparator 118.

The comparator 118 receives the output of the DCDS switch 116 through capacitor C1 as voltage VDCDS and a ramp signal through capacitor C2, and provides output to the ripple counter 120. Note that the DCDS switch 116 and comparator 118 can collectively be referred to as simply the DCDS 99, which is part of the analog processing and analog to digital conversion block 16.

At the beginning of a cycle of the ramp signal, the ripple counter 120 is reset, and begins to count. The comparator 118 asserts its output when VDCDS is equal to the ramp signal, stopping the ripple counter 120. At this point, the output ADC_Out[n] of the ripple counter 120 is proportional to VDCDS, effectuating the conversion of VASIL<n> (or Pixel_Input[n]) from an analog voltage to a digital value. Thus, the comparator 118 is functioning as the digital to analog converter of the analog processing and analog to digital conversion block 16 of FIG. 1.

The processor 25, by comparing ADC_Out to an expected value, can determine whether V_RegOut is an expected value, and if it is not, can infer that the voltage regulator 112 is not operating properly, and the advanced driver assistance system 10 can output commands causing the vehicle into which the advanced driver assistance system 10 is incorporated to take an appropriate action, such as provide warning to a driver that the advanced driver assistance system 10 is malfunctioning.

Note that the DSCS switch 116, comparator 118, and ripple counter 120 can collectively be referred to as the readout path 115.

Figure 3:
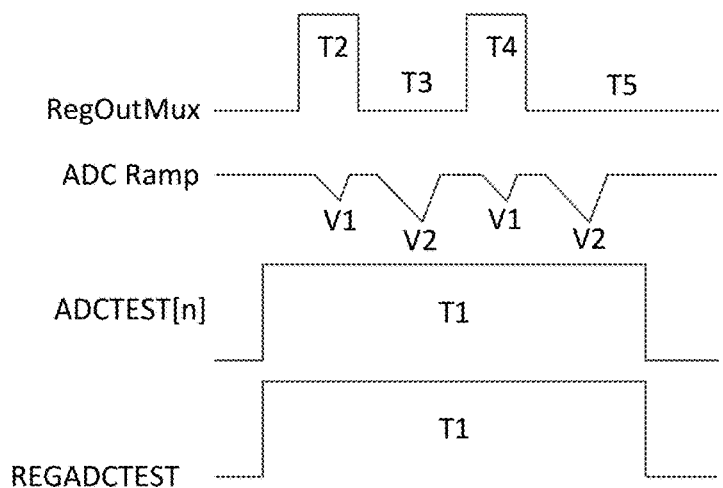
FIG. 3 is a timing diagram of the regulator voltage verification circuit of FIG. 2 in operation.

An example of operation of the regulator voltage verification circuit 100 is now described with additional reference to the timing diagram of FIG. 3. During time period T1, the REGADCTEST and ADCTEST[n] signals are asserted, so the output of the AND gate 113 goes high, asserting the VASIL_Enable[n] signal, which when inverted by inverter 111 would mean that the VASIL_EnableB[n] signal is deasserted. This in turn closes switch S1 and opens switches S2 and S3, allowing test operation to begin. The REGADCTEST and ADCTEST[n] signals remain asserted during the test operation.

During time period T2, beginning after the start of time period T1, RegOutMux is asserted, resulting in the multiplexer 114 selecting the test black signal V_Black to output as VASIL<n>. In addition, at the start of the time period T2, the ripple counter 120 is reset and begins to run. The ADC ramp signal falls from high to a first voltage V1 during time period T2.

As the ADC ramp signal falls to V1, at some point, the voltage VASIL<n> will be equal to the ADC ramp signal, resulting in the comparator 118 asserting its output, stopping the ripple counter 120. The output of the ripple counter 120, as ADC_Out[n], during time period T2 thus represents the value of VASIL<n> when V_Black is selected by the multiplexer 114. If this value is not as expected, it can be inferred that the voltage regulator 112 is malfunctioning.

During time period T3, beginning after the end of time period T2, RegOutMux is deasserted, causing selection of the test white voltage V_White by the multiplexer 114 and its corresponding output as VASIL<n>. In addition, the ripple counter 120 is reset and begins counting again at the start of time period T3. The ADC ramp signal (having charged back to high by the end of time period T2) now falls from high to a second voltage V2 that is lower than the first voltage V1, representing a longer integration time.

As the ADC ramp signal falls to V2, at some point, the voltage of VASIL<n> will be equal to the ADC ramp signal, resulting in the comparator 118 asserting its output, stopping the ripple counter 120. The output of the ripple counter 120, as ADC_Out[n], during time period T3 thus represents the value of VASIL<n> when V_White is selected by the multiplexer 114. If this value is not as expected, it can be inferred that the voltage regulator 112 is malfunctioning.

The operations described above with reference to time periods T2 and T3 are performed for row 7 of the pixel array 12. The operations described below with reference to time periods T4 and T5 will be performed for row 8 of the pixel array 12.

During time period T4, beginning after the end of time period T3, RegOutMux is asserted, resulting in the multiplexer 114 selecting the test black signal V_Black to output as VASIL<n>. In addition, at the start of the time period T4, the ripple counter 120 is reset and begins to run again. The ADC ramp signal (having charged back high by the end of time period T3) falls from high to a first voltage V1 during time period T4.

As the ADC ramp signal falls to V1, at some point, the voltage of VASIL<n> will be equal to the ADC ramp signal, resulting in the comparator 118 asserting its output, stopping the ripple counter 120. The output of the ripple counter 120, as ADC_Out[n], during time period T4 thus represents the value of VASIL<n> when V_Black is selected by the multiplexer 114. If this value is not as expected, it can be inferred that the voltage regulator 112 is malfunctioning.

During time period T5, beginning after the end of time period T4, RegOutMux is deasserted, causing selection of the test white voltage V_White by the multiplexer 114 and its corresponding output as VASIL<n>. In addition, the ripple counter 120 is reset and begins counting again at the start of time period T5. The ADC ramp signal (having charged back to high by the end of time period T4) now falls from high to a second voltage V2 that is lower than the first voltage V1, representing a longer integration time.

As the ADC ramp signal falls to V2, at some point, the voltage of VASIL<n> will be equal to the ADC ramp signal, resulting in the comparator 118 asserting its output, stopping the ripple counter 120. The output of the ripple counter 120, as ADC_Out[n], during time period T5 thus represents the value of VASIL<n> when V_White is selected by the multiplexer 114. If this value is not as expected, it can be inferred that the voltage regulator 112 is malfunctioning.

The end of time period T1 results in REGADCTEST and ADCTEST[n] falling low, resulting in VASIL_Enable[n] being output as low by the AND gate 113, and VASIL_EnableB[n] being output as high by the inverter 111. This opens switch S1, and closes switches S2 and S3, shunting nodes N0 and N3 to ground, removing the effect of the regulator voltage verification circuit 100 from the other circuitry, and grounding VASIL<n>.

Figure 4:
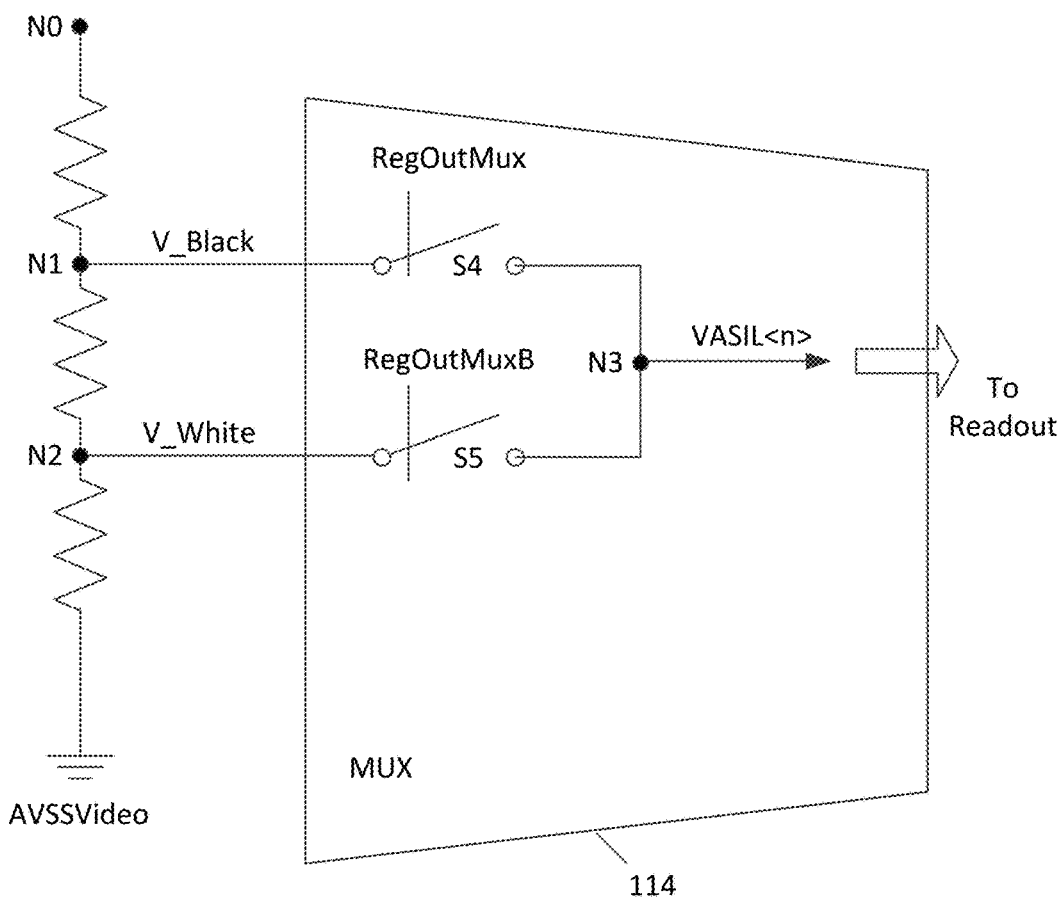
FIG. 4 is a more detailed block diagram of the multiplexer of the regulator voltage verification circuit of FIG. 2.

Further details of the multiplexer 114 are now described with additional reference to FIG. 4. The multiplexer 114 includes switch S4 coupled between nodes N1 and N3 and switch S5 selectively coupled between nodes N2 and N3. Switch S4 selectively couples V_Black at Node N1 to node N3 in response to the RegOutMux signal, while switch S5 selectively couples switch V_White at node N2 to node N3 in response to a complement of the RegOutMUX signal, labeled here as RegOutMuxB.

When output of V_Black is desired, the RegOutMux signal is asserted, closing switch S4 and opening switch S5, causing V_Black to be produced as VASIL<n>. It follows that when output of V_White is desired, the RegOutMux signal is deasserted, opening switch S4 and closing switch S5, causing V_White to be output as VASIL<n>.

Figure 5:
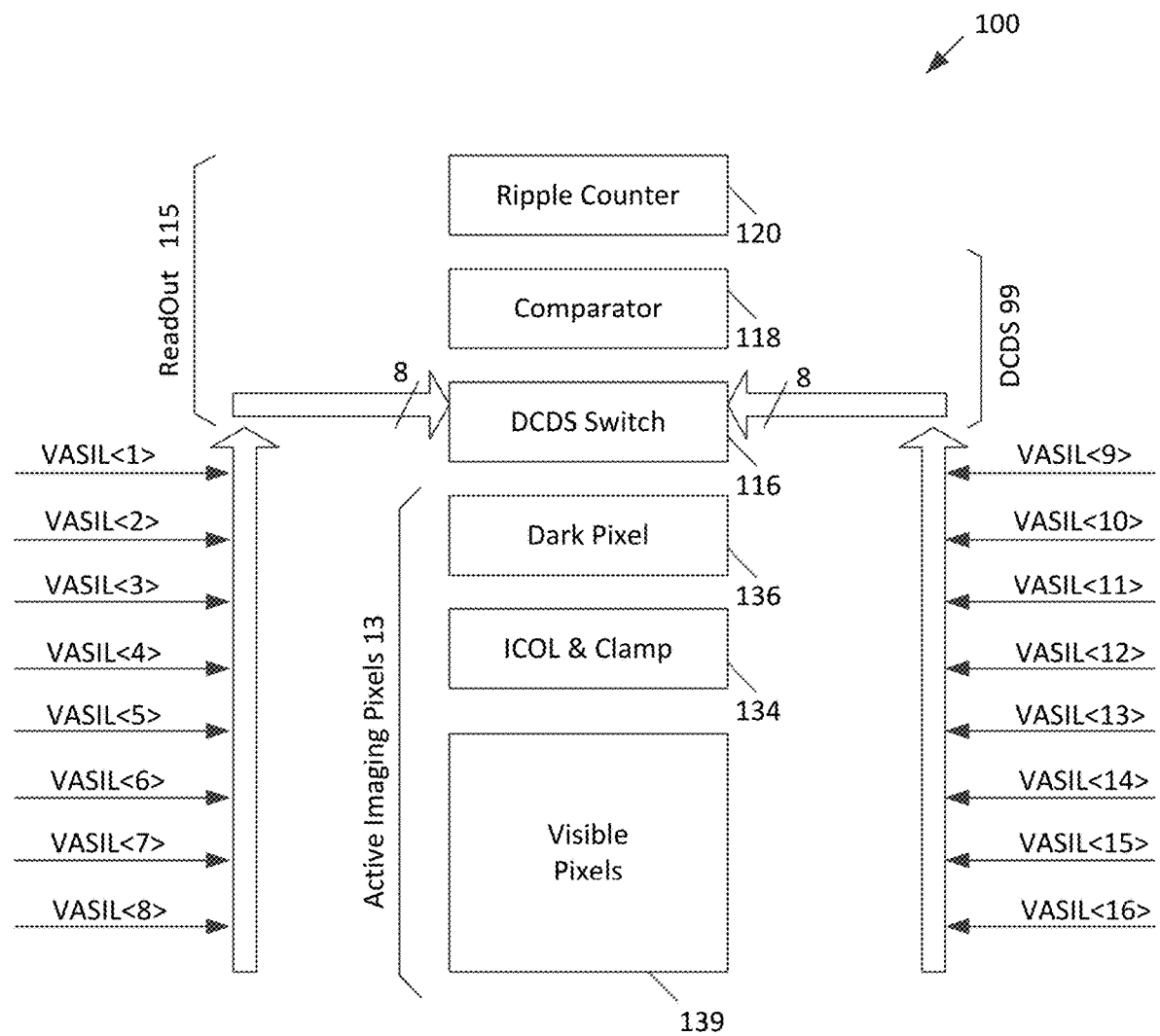
FIG. 5 is a block diagram of the regulator voltage verification circuit of FIG. 2 as implemented in a pixel array along with the analog processing and A/D conversion block of FIG. 1.

With additional reference to FIG. 5, the regulator voltage verification circuit 100 as implemented with the active imaging pixels 13 and analog processing and analog to digital conversion block 16 is now described. Here, the DCDS switch 116 receives the voltages VASIL<1>-VASIL<16>. It should be appreciated that sixteen instances of the VASIL voltage generation circuitry 98 (from FIG. 2) are used to generate the sixteen voltages VASIL<1>-VASIL<16>, and that when in test mode (REGADCTEST being asserted, and ADCTEST[n] for each VASIL voltage generation circuitry 98 being asserted), each of the voltages VASIL<1>-VASIL<16> selectively cycles between the test black voltage V_Black for that voltage or the test white voltage V_White for that voltage.

The DCDS 99 properly routes and couples the voltages VASIL<1>-VASIL<16> to other components of the pixel array 12, such as the readout path 115. Of note here is that the active imaging pixels 13 include visible (non-occluded) pixels 139, bias current generation and clamping block 134, and dark (occluded) pixels 136. By occluded, it is meant that other components are covering those pixels, so those pixels can return no value but a dark value.

Figure 6:
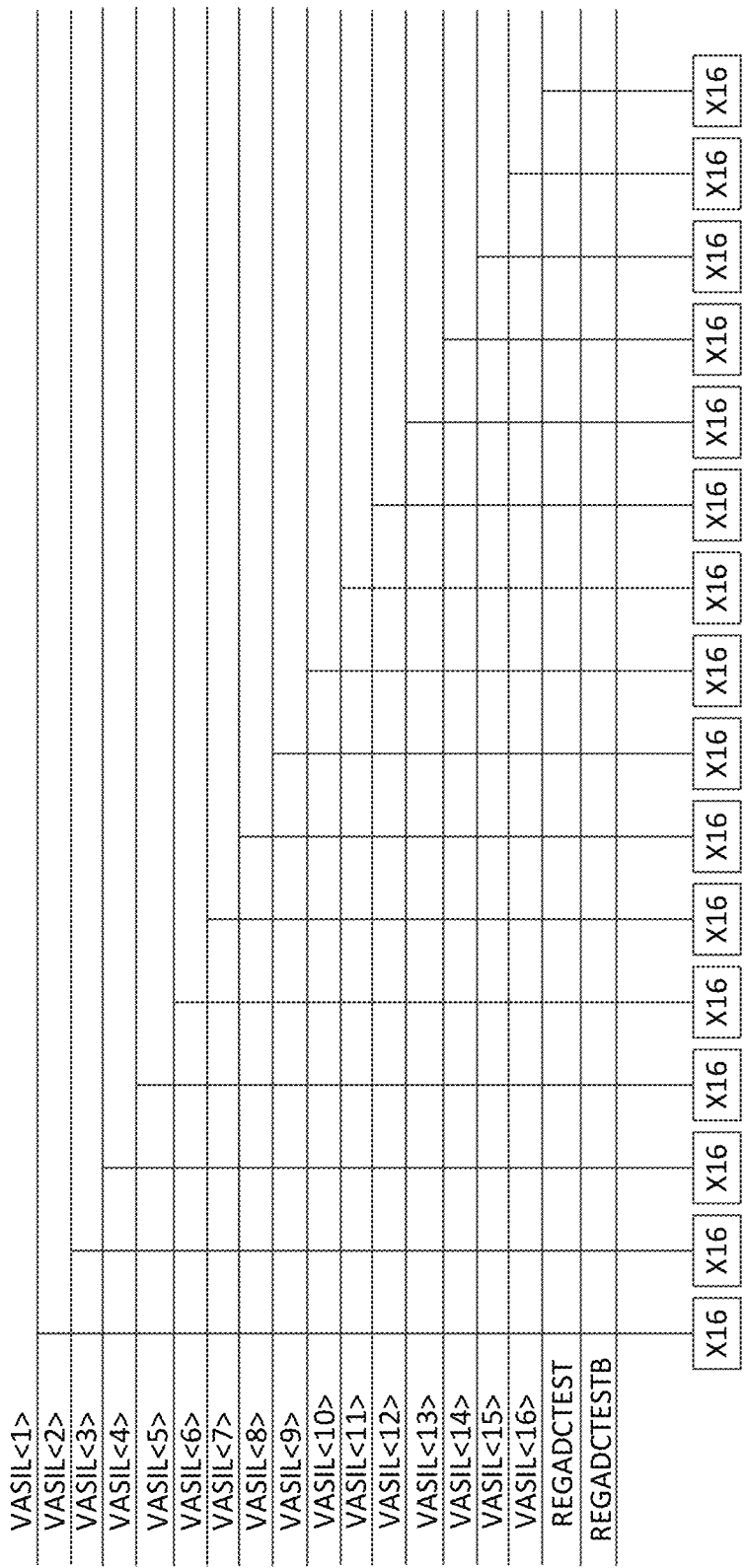
FIG. 6 is a wiring diagram illustrating how the DCDS switch of FIGS. 2 and 5 couple different voltages VASIL to different groups of the columns of the pixel array.

The connections made by the DCDS switch 116 and the other components of the pixel array 12 are shown in FIG. 6. Here, it can be seen that each of the voltages VASIL<1>-VASIL<16> is potently coupled to sixteen (shown as ×16) columns of the pixel array 12. As will be explained below, each of the voltages VASIL<1>-VASIL<16> may be coupled to every column of a respective group of sixteen, to two columns of a respective group of sixteen (which improves settling time), or to any number of columns of a respective group of sixteen.

Figure 7:
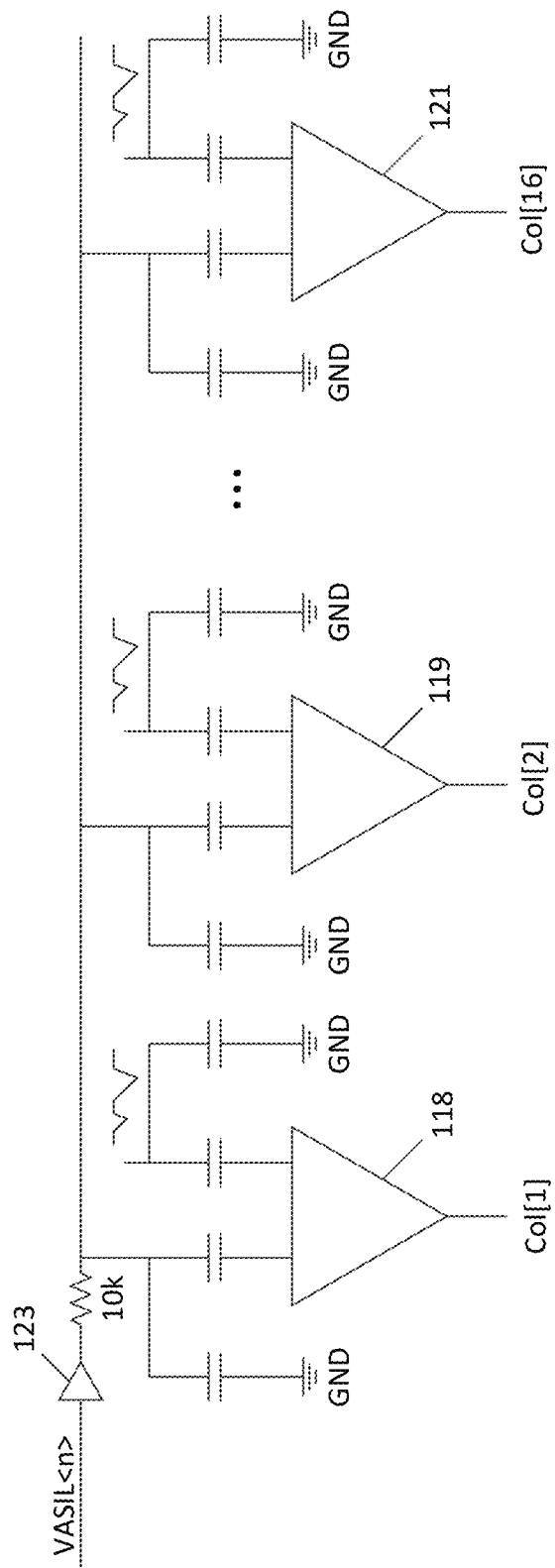
FIG. 7 is a block diagram of one of the ways in which the DCDS switch of FIGS. 2, 5, and 6 can couple the different voltages VASIL to different groups of the columns of the pixel array.

An example shown in FIG. 7 is a scenario where the comparators 118, 119, and 121 of Col[1], Col[2] . . . Col[16] are coupled to VASIL<n>. An optional buffer 123 is coupled to VASIL<n> to improve settling time.

Figure 8:
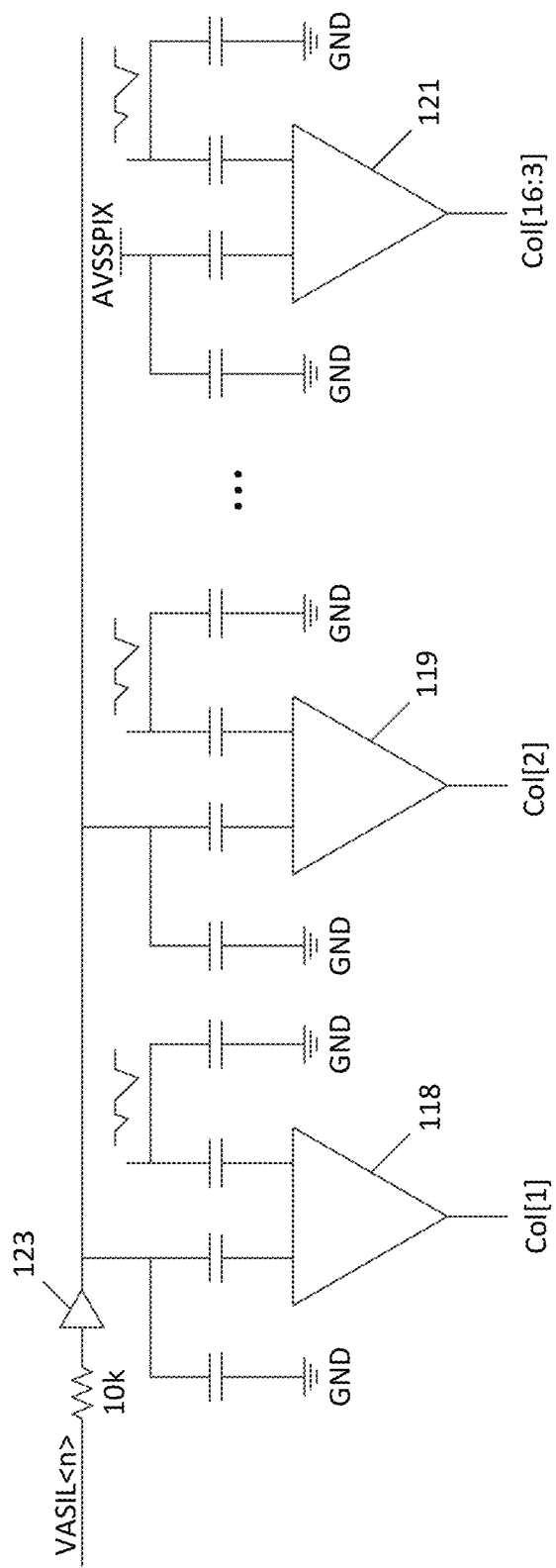
FIG. 8 is a block diagram of a different one of the ways in which the DCDS switch of FIGS. 2, 5, and 6 can couple the different voltages VASIL to different groups of the columns of the pixel array.

An example shown in FIG. 8 is a scenario where the comparators 118 and 119 of Col[1] and Col[2] in a group of sixteen are coupled to VASIL<n>, while other comparators of the other columns are not. An optional buffer 123 is coupled to VASIL<n> to improve settling time. In addition, here, the selection of two out of sixteen columns also reduces capacitive loading to approximately one eighth of what it would be if all sixteen columns were coupled to VASIL<n>.

Figure 9:
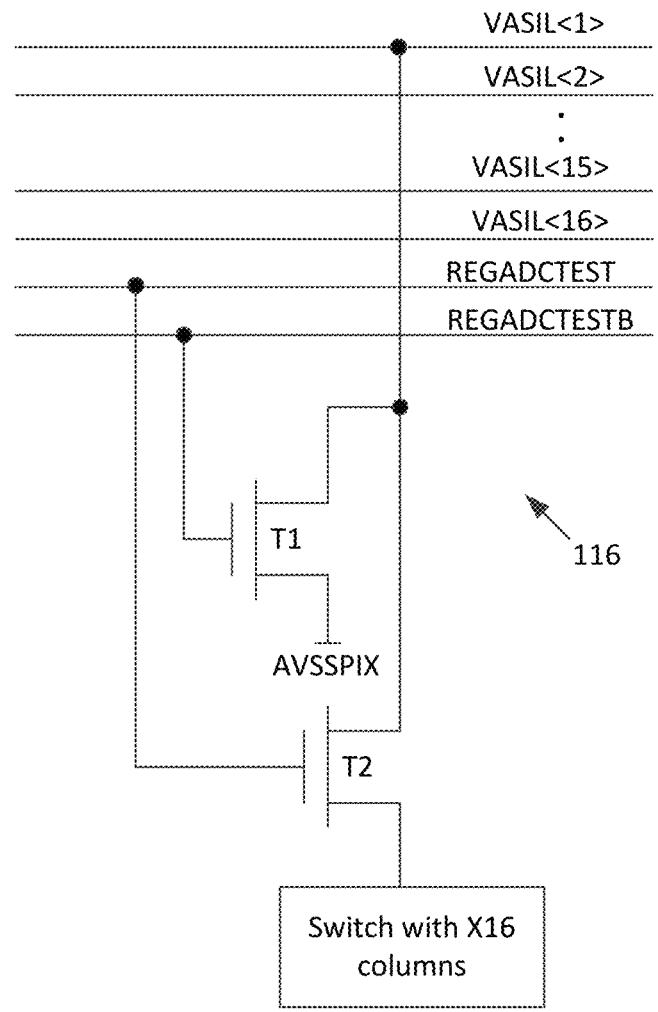
FIG. 9 is a schematic diagram showing the circuitry used to make the connections shown in FIGS. 6-8 between voltages VASIL and columns of the pixel array.

The switching circuitry used to couple the groups of sixteen columns to the voltages VASIL<1>-VASIL<16> is shown in FIG. 9. Here, NMOS transistor T1 has its source coupled to ground, its gate coupled to an inverse of the REGADCTEST signal, shown here as REGADCTESTB, and its drain coupled to VASIL<1>. NMOS transistor T2 has its source coupled to one group of sixteen columns, its gate coupled to the REGADCTEST signal, and its drain coupled to VASIL<1>. Thus, when REGADCTEST is not asserted, meaning that REGADCTESTB will be asserted, NMOS transistor T1 will turn on, while NMOS transistor T2 will turn off, resulting in the shunting of VASIL<1> to the reference voltage AVSSPIX. Likewise, when REGADCTEST is asserted, meaning that REGADCTESTB will not be asserted, NMOS transistor T1 will turn off, while transistor T2 turns on, resulting in NMOS transistor T2 acting as a switch and providing an output proportional to VASIL<1>.

Figure 10:
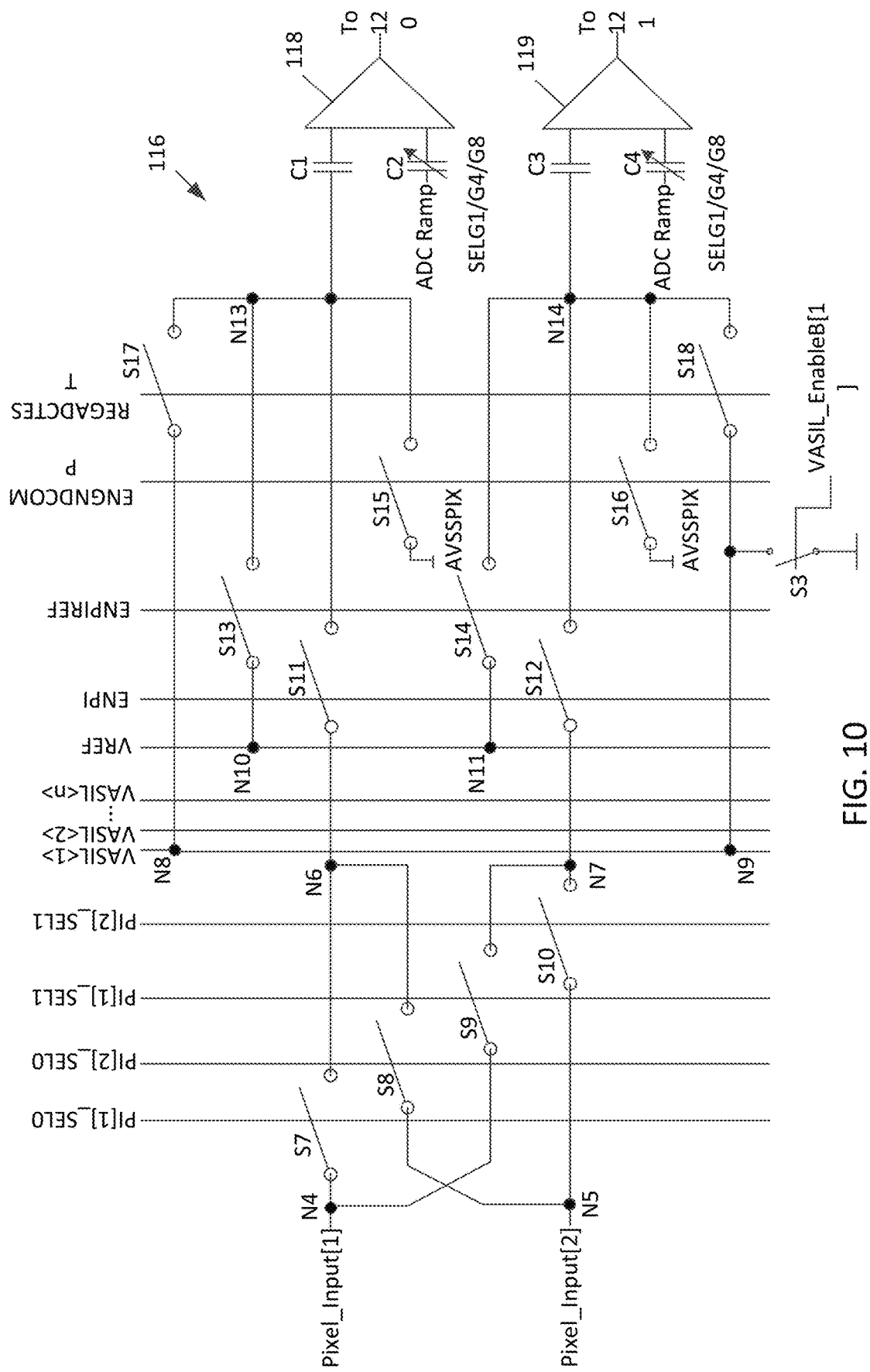
FIG. 10 is a detailed schematic diagram of the DCDS switch of FIGS. 2, 5, and 6.

The remainder of the circuitry used to couple the groups of sixteen columns to the voltages VASIL<1>-VASIL<16> is shown in FIG. 10. It is first noted that each of the switches S17 and S18 shown as abbreviations are actually NMOS transistor T2 (replicated for each of S17 and S18), while switch S3 is actually the NMOS transistor T1 (replicated as needed).

Nodes N4 and N5 respectively receive Pixel_Input[1] and Pixel_Input[2]. Switch S7 selectively couples node N4 to node N6 in response to the PI1_SEL0 signal. Switch S8 selectively couples node N5 to node N6 in response to the PI2_SEL0 signal. Switch S9 selectively couples node N4 to node N7 in response to the PI1_SEL1 signal. Switch S10 selectively couples node N5 to node N7 in response to the PI2_SEL1 signal.

Nodes N8 and N9 respectively receive the voltage VASIL<1>. Switches S17 and S18 selectively couple nodes N8 and N9 to nodes N13 and N14 in response to the REGADCTEST signal. Nodes N10 and N11 respectively receive the reference voltage signal VREF. Switches S13 and S14 selectively couple the nodes N10 and N11 to nodes N13 and N14 in response to the ENPIREF signal.

Switches S11 and S12 selectively couple nodes N6 and N7 to nodes N13 and N14 in response to the ENPI signal. Switches S15 and S16 selectively couple nodes N13 and N14 to the reference voltage AVSSPIX in response to the ENGNDCOMP signal.

The comparator 118 receives the signal at node N13 through capacitor C1 and the ADC ramp signal through capacitor C2. The comparator 119 receives the signal at node N14 through capacitor C3 and the ADC ramp signal through capacitor C4. Of note is that the capacitors C2 and C4 may in some instances, such as that shown, be variable capacitors and have capacitances that change responsive to the signals SELG1/SELG4/SELG8 signal.

Figure 11:
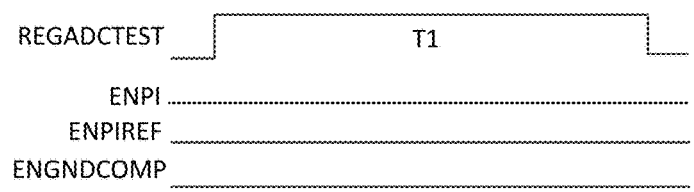
FIG. 11 is a timing diagram of the operation of the DCDS switch circuitry shown in FIG. 10.

Operation of the DCDS switch 116 is now described with further reference to FIG. 11. During the test operation, which occurs during time period T1, the REGADCTEST signal and VASIL_Enable[1] signal are asserted (deasserting VASIL_EnableB[1]), while the ENPI, ENPIREF, ENGNDCOMP, PI[1]_SEL0, PI1[2]_SEL0, PI[1]_SEL1, and PI[2]_SEL1 signals are deasserted. This serves to close switches S17-S18, and open switches S3, S7-S10, and S11-S16. As a result, the voltage VASIL<1> is passed to nodes N13 and N14. Functionality continues as explained above with reference to FIG. 2, with the comparators 118 and 119 asserting their outputs when the voltages on nodes N13 and N14 are equal to the ADC ramp voltage.

Operation of the DCDS switch 116 during normal operations to perform digital correlated double sampling is not necessary, and proceeds according to those known techniques.

Figure 12:
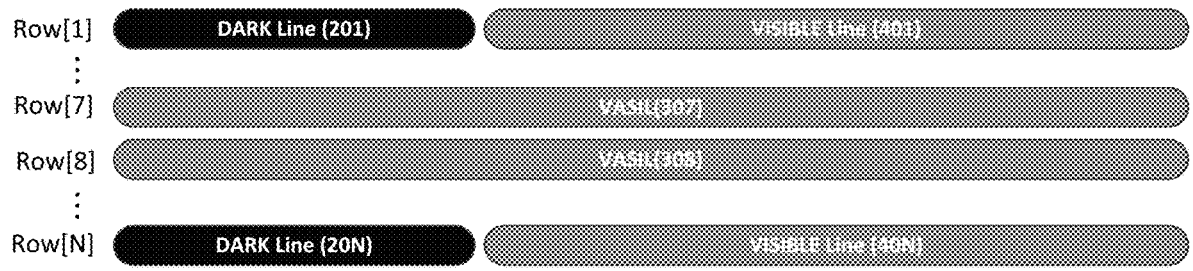
FIG. 12 is a diagram showing the order for the data read from each row of the pixel array of FIG. 2.

Referring back to FIG. 2, and referring additionally to FIG. 12, each row of the pixel array 12 is sequentially read out. This read out is diagrammatically shown in FIG. 12. Here, it can be seen that in a pixel array 12 having N rows, for rows 1-6 and 9-N, first the dark (occluded by other structures) columns of a given row of the active imaging pixels 13, labeled here as 201 and 20N, are read out. Then, the visible columns of a given row of the active imaging pixels 13, labeled here as 401 and 40N, are read out. In this specific example, rows 7 and 8 of the pixel array 12 include the regulator voltage verification circuit 100. For these rows, only the voltage VASIL, labeled here as 307 and 308, is read out. The test results provided by the ADCOUT[7] and ADCOUT[8] signals, for this instance, may optionally be averaged.

It should be appreciated however that any number of the rows may include the regulator voltage verification circuit 100. For example, row 7 may include the regulator voltage verification circuit 100.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method for use with an array of image pixels including a plurality of rows with active imaging pixels and at least one row with regulator voltage verification circuits, wherein the plurality of rows with active imaging pixels and the at least one row with regulator voltage verification circuits operate based upon a regulated voltage, the method comprising testing the regulated voltage by:
   activating the at least one row with regulator voltage verification circuits to operate in test mode;
   generating a test black voltage and a test white voltage as a function of the regulated voltage;
   alternatively passing the test black voltage and the test white voltage to a switching circuit as a test voltage;
   passing the test voltage from the switching circuit to a comparison circuit that asserts a counter reset signal when the test voltage and an analog to digital conversion signal are equal in voltage; and
   resetting and starting a counter at a beginning of each test cycle within the test mode, stopping the counter upon assertion of the counter reset signal, and outputting a count of the counter, the count being proportional to the test voltage when in the test mode.

2. The method of claim 1, further comprising generating the analog to digital conversion signal by generating a voltage ramping signal that ramps in a repeating pattern between, in order, a base voltage, a first voltage, the base voltage, and a second voltage; wherein the first voltage is not equal to the second voltage, and wherein the first and second voltages are not equal to the base voltage.

3. The method of claim 2, further comprising ramping the voltage ramping signal to the first voltage when the test black voltage is being passed to the switching circuit as the test voltage, and ramping the voltage ramping signal to the second voltage when the test white voltage is being passed to the switching circuit as the test voltage.

4. An electronic device, comprising:
   a pixel array including a plurality of rows with active imaging pixels, and at least one row with regulator voltage verification circuits;
   wherein each of the regulator voltage verification circuits comprises:
      a test voltage generation circuit configured to generate a test voltage;
      a switching circuit configured to receive the test voltage and an image pixel output signal, and to pass the test voltage as output when in a test mode;
      a comparison circuit configured to receive the test voltage output from the switching circuit and an analog to digital conversion signal, and to assert a counter reset signal when the output from the switching circuit and the analog to digital conversion signal are equal in voltage; and
      a counter configured to begin counting at a beginning of each test cycle within the test mode, to stop counting upon assertion of the counter reset signal, and to output its count upon stopping counting;
   wherein the count is proportional to the test voltage when in the test mode; and
   a processor configured to receive output from the counters of the regulator voltage verification circuits, compare those outputs to expected values, and perform at least one action based upon those outputs not being within a threshold of the expected values.

5. The electronic device of claim 4, wherein the test voltage generation circuit is configured to generate upper and lower test voltages representing upper and lower expected voltages of the image pixel output signal, respectively; wherein the test voltage generation circuit is configured to pass the upper test voltage as the test voltage in response to assertion of a multiplexer select signal, and to pass the lower test voltage as the test voltage in response to deassertion of the multiplexer select signal.

6. The electronic device of claim 5, wherein the test voltage generation circuit comprises:
   a voltage divider coupled to a reference voltage, with a first tap of the voltage divider producing the upper test voltage and a second tap of the voltage divider producing the lower test voltage; and
   a multiplexer having inputs coupled to the first and second taps of the voltage divider to receive the upper and lower test voltages, and to pass the upper or lower test voltage as output based upon a logic level of the multiplexer select signal.

7. The electronic device of claim 6, wherein the test voltage generation circuit further comprises:
   a logic circuit configured to receive as input a master test mode enable signal and an individual pixel test mode enable signal, and to generate a test mode enable signal as a result of a logical operation between the master test mode enable signal and the individual pixel test mode enable signal;

a first switch selectively coupling a regulated voltage to the voltage divider in response to the test mode enable signal;

a second switch selectively shunting the voltage divider to ground in response to an inverse of the test mode enable signal; and a third switch selectively shunting the output of the multiplexer to ground in response to the inverse of the test mode enable signal.

8. The electronic device of claim 6, wherein the comparison circuit comprises a comparator receiving the output from the switching circuit at a first terminal through a first capacitor and the output from the analog to digital conversion signal at a second terminal through a second capacitor; and wherein the analog to digital conversion signal comprises a voltage ramping signal ramping in a repeating pattern between, in order, a base voltage, a first voltage, the base voltage, and a second voltage, with the first voltage being unequal to the second voltage, and with the first and second voltages being unequal to the base voltage.

9. The electronic device of claim 8, wherein the ramping signal ramps to the first voltage when the multiplexer is set by the multiplexer select signal to pass the upper test voltage and ramps to the second voltage when the multiplexer is set by the multiplexer select signal to pass the lower test voltage.

10. The electronic device of claim 4, wherein the at least one action comprises outputting commands causing a vehicle incorporating an advanced driver assistance system to provide warning to a driver that the advanced driver assistance system is malfunctioning based on determining a voltage regulator is not operating properly.

11. A method for testing a regulated voltage, comprising:

activating regulator voltage verification circuits to operate in test mode;

generating a test black voltage and a test white voltage as a function of the regulated voltage;

alternatively passing the test black voltage and the test white voltage to a switching circuit as a test voltage;

passing the test voltage from the switching circuit to a comparison circuit that asserts a counter reset signal when the test voltage and an analog to digital conversion signal are equal in voltage; and resetting and starting a counter at a beginning of each test cycle within the test mode, stopping the counter upon assertion of the counter reset signal, and outputting a count of the counter, the count being proportional to the test voltage when in the test mode.

12. The method of claim 11, further comprising generating the analog to digital conversion signal by generating a voltage ramping signal that ramps in a repeating pattern between, in order, a base voltage, a first voltage, the base voltage, and a second voltage; wherein the first voltage is not equal to the second voltage, and wherein the first and second voltages are not equal to the base voltage.

13. The method of claim 12, further comprising ramping the voltage ramping signal to the first voltage when the test black voltage is being passed to the switching circuit as the test voltage, and ramping the voltage ramping signal to the second voltage when the test white voltage is being passed to the switching circuit as the test voltage.

* * * * *